United States Patent
Ancheta, Jr. et al.

(10) Patent No.: US 7,244,636 B2
(45) Date of Patent: Jul. 17, 2007

(54) SEMICONDUCTOR ASSEMBLY FOR IMPROVED DEVICE WARPAGE AND SOLDER BALL COPLANARITY

(75) Inventors: Patricio V. Ancheta, Jr., Baguio (PH); Ramil A. Viluan, Baguio (PH); James R. M. Baello, Quezon (PH); Elaine B. Reyes, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 87 days.

(21) Appl. No.: 11/253,940

(22) Filed: Oct. 19, 2005

(65) Prior Publication Data

US 2007/0085171 A1  Apr. 19, 2007

(51) Int. Cl.
  *H01L 21/00* (2006.01)
  *H01L 21/30* (2006.01)
  *H01L 29/40* (2006.01)

(52) U.S. Cl. ............... 438/118; 438/106; 438/455; 438/457; 257/783; 257/E21.122; 257/E21.48

(58) Field of Classification Search ............... 438/118, 438/455, 457, 106; 257/783, E21.122, E21.48, 257/E21.519
  See application file for complete search history.

(56) References Cited

U.S. PATENT DOCUMENTS

2001/0005602 A1*  6/2001  Mimata et al. ............. 438/107
2003/0052419 A1*  3/2003  Ujiie et al. .................. 257/787

* cited by examiner

*Primary Examiner*—Long K. Tran
(74) *Attorney, Agent, or Firm*—Yingsheng Tung; Wade James Brady, III; Frederick J. Telecky, Jr.

(57) ABSTRACT

A semiconductor device with a chip (505), its position defining a plane, and an insulating substrate (503) with first and second surfaces; the substrate is substantially coplanar with the chip, without warpage. One of the chip sides is attached to the first substrate surface using adhesive material (504), which has a thickness. The thickness of the adhesive material is distributed so that the thickness (504*b*) under the central chip area is equal to or smaller than the material thickness (504*a*) under the peripheral chip areas. Encapsulation compound (701) is embedding all remaining chip sides and the portions of the first substrate surface, which are not involved in the chip attachment. When reflow elements (720) are attached to the substrate contact pads, they are substantially coplanar with the chip.

6 Claims, 3 Drawing Sheets

SEMICONDUCTOR ASSEMBLY FOR IMPROVED DEVICE WARPAGE AND SOLDER BALL COPLANARITY

FIELD OF THE INVENTION

The present invention is related in general to the field of semiconductor devices and processes and more specifically to the structure and method of semiconductor chip attach in the device assembly process.

DESCRIPTION OF THE RELATED ART

Any user of semiconductor components, who has the task of assembling components on electronic boards, can describe the aggravation encountered when just a single component lacks sufficient coplanarity for the board assembly. To avoid the difficulties, stringent requirements have often been established. As an example, for semiconductor devices with surface mount leads, the requirements included a coplanarity of about 0.14 mm for a lead pitch of 1 mm, and a coplanarity of about 0.05 mm for a lead pitch of 0.3 mm. The requirements increased rapidly with shrinking lead pitch.

For devices with solder balls, such as ball grid arrays (BGAs), insufficient coplanarity is manifested by a minority of solder balls not touching the substrate concurrently with the majority of balls. Consequently, efforts have been undertaken in literature to correct the coplanarity problems with solder balls of unequal size or delayed-reflow solder pastes. These efforts brought only limited success.

SUMMARY OF THE INVENTION

Applicants recognize the fact that, in BGAs, coplanarity problems are in most cases caused by device warpage and, consequently, an improvement of coplanarity should most readily be based on a reduction or elimination of device warpage. This approach is an inherently low-cost and robust methodology, since it eliminates coplanarity problems at the root cause. In addition, the approach is applicable to many device types and product families, and can be fine-tuned to a wide variety of materials characteristics of the substrates.

One embodiment of the invention is a semiconductor device with a chip, its position defining a plane, and an insulating substrate with first and second surfaces; the substrate is substantially coplanar with the chip, without warpage. One of the chip sides is attached to the first substrate surface using adhesive material, which has a thickness. The thickness of the adhesive material is distributed so that the thickness under the central chip area is equal to or smaller than the material thickness under the peripheral chip areas. Encapsulation compound is embedding all remaining chip sides and the portions of the first substrate surface, which are not involved in the chip attachment.

When a plurality of conductive contact pads are distributed over at least portions of the second substrate surface and a reflow element attached to each contact pad, this plurality of reflow elements is substantially coplanar with the chip.

Another embodiment of the invention is a method for fabricating a semiconductor device. An insulating substrate with first and second surfaces is provided. The second surface is placed on a chuck with openings for vacuum suction; the surface of the chuck is effectively convex, often practically achieved by a raised middle portion. The vacuum suction is activated so that the substrate is bent practically convex over the chuck surface. Adhesive material is then placed on the first substrate surface; the material is viscous and has a thickness. Next, a semiconductor chip is provided, which has sides, wherein one of the sides is intended for mechanical attachment. This attachment chip side is placed on the adhesive material; the thickness of the material becomes thereby distributed so that the thickness under the central area of the chip side is smaller than or equal to the material thickness under the peripheral areas of the chip side; the position of the chip defines a plane.

The vacuum suction is then de-activated and the substrate is removed from the chuck together with the assembled chip. All remaining chip surfaces and the portions of the first substrate surface not involved in the chip attachment are embedded in a thermoset encapsulation compound. The compound is polymerized, causing volumetric compound shrinkage, which pulls the substrate into a position substantially coplanar with the chip. The device does not exhibit warpage.

When the substrate is provided with a plurality of conductive contact pads distributed over at least portions of the second substrate surface, a reflow element can be attached to each contact pad; the plurality of reflow elements are then substantially coplanar with the substrate and the chip.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
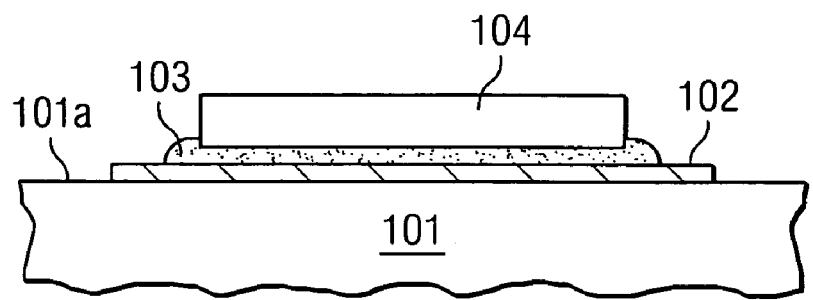
FIG. 1 is a schematic cross section of a substrate with an assembled semiconductor chip resting on a chuck with planar surface, in known technology.

FIG. 1 illustrates schematically a heatable chuck 101, which has a planar, flat surface 101a. In surface 101a are a plurality of openings (not shown in FIG. 1), through which a vacuum can be applied so that it sucks an object on surface 101a to hold it tight against the surface.

Before the vacuum is turned on, a substrate 102 is placed on surface 101a; the substrate is also flat. Then the vacuum is turned on and substrate 102 is held tight against surface 101a. A pre-determined amount of viscous adhesive material 103 (usually polyimide or epoxy) is deposited on substrate 102 (usually by a syringe). A semiconductor chip 104 is slightly pressed against attach material 103 and the material is partially polymerized by the thermal energy of the chuck. Chip 104 and substrate 102 are coplanar.

Figure 2:
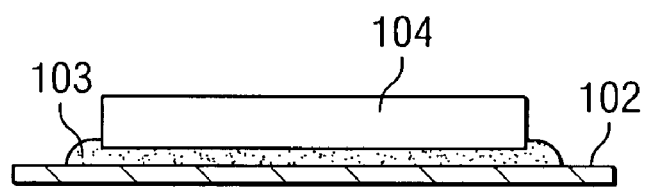
FIG. 2 is a schematic cross section of an assembled device in known technology.

When the assembled chip and substrate are lifted from the chuck (see FIG. 2), the substrate 102 still has its planar configuration; it is still coplanar to chip 104.

Figure 3:
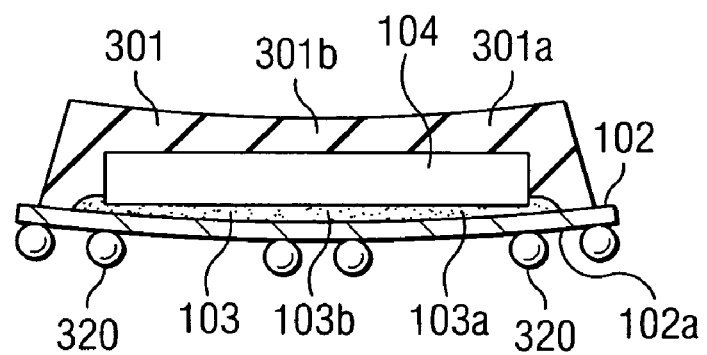
FIG. 3 shows a schematic cross section of a finished device with polymerized molding compound and a plurality of solder balls, in known technology.

The assembly is then encapsulated in thermoset polymer compound 301, usually molding compound. After the encapsulation, compound 301 is polymerized by storing the device at elevated temperatures for several hours. During the polymerization process, compound 301 undergoes a volumetric shrinkage. As a result, the finished device acquires a shape as schematically indicated in FIG. 3: Substrate 102 is pulled towards the polymer compound and becomes curved outward (concave) under the chip 104. Substrate 102 is no longer coplanar with chip 104. Attach material 103 ends up thicker (301b) in the center of chip 104 compared to its thickness under the chip edges (301a). And the polymerized encapsulation material may have an outer surface 301a, which not planar, but exhibits a slight dip 301b in the center.

When solder balls 320 are attached to the outer surface 102a of substrate 102 and the balls are of equal size, the plane of the balls cannot be coplanar with chip 104. When a device as depicted in FIG. 3 is to be attached to a circuit board, the solder is molten. Whenever the lack of coplanarity is so pronounced that it cannot be compensated by the reflowing solder, failures in board attach will occur.

Figure 4:
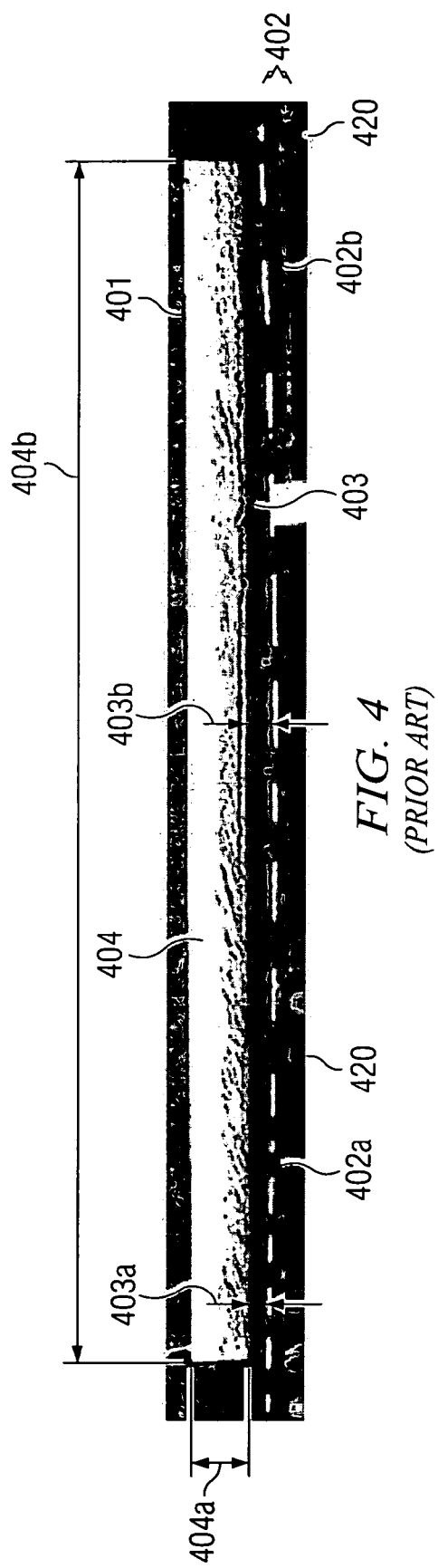
FIG. 4 is a microphotograph of a cross section of an actual large-chip semiconductor device after polymerization of the molding compound in known technology.

The microphotograph in FIG. 4 of a cross section of an actual device encapsulated by molding material 401 and assembled on a chuck with planar surface illustrates the unequal thickness of the attach material. Chip 404 has a thickness 404a of 275 µm and a length 404b of 5.75 mm. The chip attach material 403 has a thickness 403b of about 108 µm in the center, but only a thickness 403a of approximately 87 µm at the chip edges; the difference between center and periphery is about 21 µm.

As the microphotograph shows, the substrate 402 in FIG. 4 follows the curved outline of the chip attach material 403. The following parts of the substrate are visible: The intermittent white-and-black layer 402a consists of the copper traces separated by the solder mask; the grey layer 402b is the polyimide tape. The whitish spheres are the solder balls 420. The plurality of solder balls is not coplanar with the chip. (Finer detail of the substrate such as solder mask, nickel layer, etc. is not shown in FIG. 4).

Figure 5A:
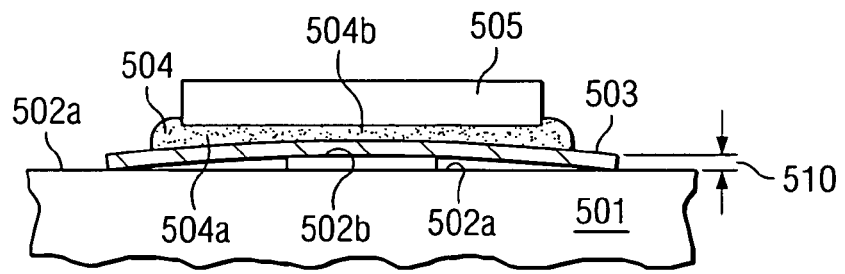
FIG. 5A is a schematic cross section of an example of a substrate with an assembled semiconductor chip resting on a chuck with a surface contour according to the invention.

The embodiment of FIG. 5A depicts an assembly apparatus modified according to the invention. The heatable chuck 501 has a surface suitable for placing sheet-like substrates. The surface has openings for vacuum suction (not shown in FIG. 5A). The chuck surface has area portions 502a in a first plane and at least one area portion 502b in a second plane elevated relative to the first plane so that the summary contour of the chuck surface becomes convex. An originally flat sheet-like substrate 503, when placed on the chuck surface and pulled towards the surface by the activated vacuum, will follow the summary convex contour and adopt this contour, as illustrated in FIG. 5A.

As an example, the height difference 510 between surface 502a and 502b in FIG. 5A may be 25 µm for devices such as the µStar™ BGA. In other embodiments, the height difference may be larger of smaller. In yet other, more expensive embodiments, the whole surface of chuck 501 is smoothly micro-machined to obtain a continuously convex contour. The degree of convexity of the chuck surface is dependent on the material of the substrate, the area of the substrate, and the amount, composition, and polymerization of the encapsulation compound.

In the next process step, a pre-determined amount of viscous adhesive material 504 (usually polyimide or epoxy) is deposited on substrate 503 (usually by a syringe). A semiconductor chip 505 is slightly pressed against attach material 504 and the material is partially polymerized by the thermal energy of the chuck.

As a result of the convex substrate shape, the thickness of the attach material 504 is distributed so that the thickness 504b in the central area (under the chip) is smaller than the material thickness 504a in the peripheral areas of the chip. When a different height 510 of the central chuck surface is selected, the central material thickness 504b may be left up to (but will not be larger than) the peripheral thickness 504a.

Figure 5B:
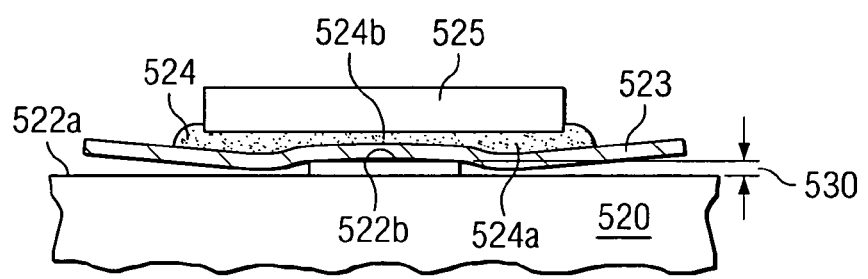
FIG. 5B is a schematic cross section of another example of a substrate with an assembled semiconductor chip resting on a chuck with a surface contour according to the invention.

The considerations described above are preferably realized for relatively hard substrates, which operate in the plastic regime of the stress-strain relationship. For softer substrates operating in the plastic regime, the substrate behavior on the chuck 520 with the raised surface center looks schematically as shown in FIG. 5B. The height difference 530 between surface 522a and 522b is 25 µm. While the summary contour of the chuck surface is again convex, the originally flat sheet-like substrate 523, when placed on the chuck surface and pulled towards the surface by the activated vacuum, will follow the actual surface contour more closely and adopt a more wavy profile as illustrated in FIG. 5B.

In the next process step, a pre-determined amount of viscous adhesive material 524 (usually polyimide or epoxy) is deposited on substrate 523 (usually by a syringe). A semiconductor chip 525 is slightly pressed against attach material 524 and the material is partially polymerized by the thermal energy of the chuck.

As a result of the wavy convex substrate shape, the thickness of the attach material 524 is distributed so that the thickness 524b in the central area (under the chip) is smaller than the material thickness 524a in the peripheral areas of the chip. When a different height 530 of the central chuck surface is selected, the central material thickness 524b may be left up to (but will not be larger than) the peripheral thickness 524a.

Figure 6:
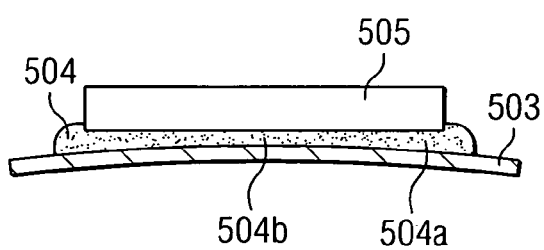
FIG. 6 is a schematic cross section of an assembled device, after the device has been assembled on a vacuum chuck according to the invention.

As FIG. 6 illustrates, when the assembled chip and substrate are lifted from the chuck, the substrate 503 still retains its convex configuration. The thickness of the attach material 504 is distributed so that the thickness 504b under the central area of the chip 505 is smaller than (or up to equal to) the material thickness 504a under the peripheral areas of the chip. The next process steps are summarized in FIG. 7.

Figure 7:
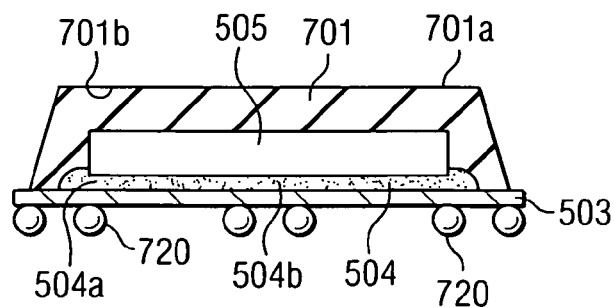
FIG. 7 shows a schematic cross section of a finished device with polymerized molding compound and a plurality of solder balls, after the device has been assembled on a vacuum chuck according to the invention.

FIG. 7 describes the effect of the encapsulation of the assembly in thermoset polymer compound 701, preferably a molding compound. Because of the thermoset nature, compound 701 has to be polymerized after the encapsulation, preferably by storing the device at elevated temperatures for several hours. During the polymerization process, compound 701 undergoes a volumetric shrinkage. As a result, the finished device acquires a shape as schematically indicated in FIG. 7: Substrate 503 is pulled towards the polymer compound and becomes planar under the chip 505. Attach material 504 ends up with a thickness distribution so that the material thickness 504b under the central chip area is equal to (or still slightly smaller than) the material thickness 504a under the peripheral chip areas. Consequently, substrate 503 is now coplanar with chip 505. The polymerized encapsulation material 701 has an outer surface 701a, which is also coplanar with chip 505.

When solder balls 720 are attached to the outer surface of substrate 503 and the balls are of equal size, the plane of the balls is coplanar with chip 505. When a device as depicted in FIG. 7 is to be attached to a circuit board, the solder is molten and there will be no failures in board attach.

Figure 8:
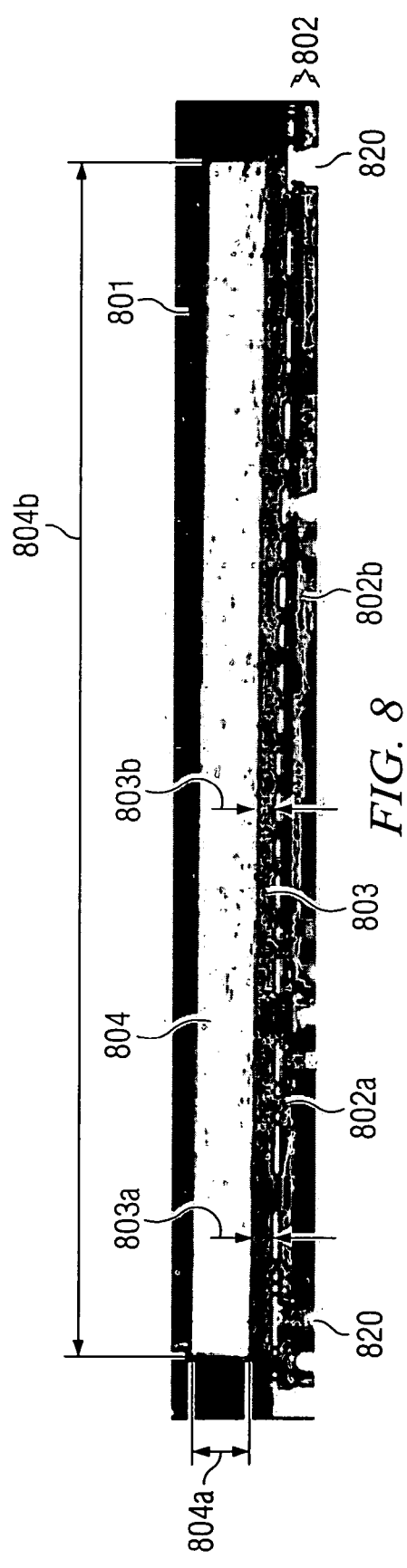
FIG. 8 is a microphotograph of a cross section of an actual large-chip semiconductor device after assembly on a vacuum chuck according to the invention and after polymerization of the molding compound.

The microphotograph in FIG. 8 of a cross section of an actual device, assembled on a chuck with effectively convex surface and encapsulated by molding material 801, illustrates the equal thickness of the attach material 803. Chip 804 has a thickness 804a of 275 µm and a length 804b of 5.75 mm. The chip attach material 803 has an approximately uniform thickness 803a of about 95 µm throughout its length. More precisely, the difference between the thickness in the center of 94 µm and the thickness at the periphery between 91 and 99 µm has reduced the difference to 10 µm.

As the microphotograph shows, the substrate 802 in FIG. 8 follows the planar outline of the chip attach material 803 (for an explanation of the photograph detail visible in FIG. 8 see description under FIG. 4). The whitish spheres are the solder balls 820. The plurality of solder balls is coplanar with the chip 804.

Statistical data collected from many manufacturing lots about coplanarity and board assembly have confirmed the reduced device warpage, improved solder ball coplanarity (at least 26%) and improved board attach reliability based on the effectively convex assembly chuck according to the invention. The only significant reliability factor left was related to solder ball variability.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, more than one raised center of the assembly chuck may be advisable for large area chips. As another example, for production with high throughput the cost of a micro-machined concave chuck surface may be justified; if would enhance the precision of the attach material thickness uniformity. It is therefore intended that the appended claims encompass any such modifications.

We claim:

1. A method for fabricating a semiconductor device comprising the steps of:
   providing an insulating substrate having first and second surfaces;
   placing the second substrate surface on a chuck with openings for vacuum suction, the surface of the chuck being effectively convex;
   activating the vacuum suction so that the substrate is bent conformal with the effectively convex chuck surface;
   placing adhesive material on the first substrate surface, the material being viscous and having a thickness;
   providing a semiconductor chip having sides, one of the sides intended for mechanical attachment;
   placing the attachment chip side on the adhesive material, whereby the thickness of the material becomes distributed so that the thickness under the central chip area is smaller than or equal to the material thickness under the peripheral chip areas; the position of the chip defining a plane;
   de-activating the vacuum suction and removing the substrate together with the assembled chip from the chuck;
   embedding all remaining chip surfaces and the portions of the first substrate surface not involved in the chip attachment in thermoset encapsulation compound; and
   polymerizing the compound, causing volumetric compound shrinkage, thereby pulling the substrate into a position substantially coplanar with the chip and rendering the thickness distribution of the adhesive material so that the thickness under the central chip area is equal to or smaller than the material thickness under the peripheral chip areas.

2. The method according to claim 1 further comprising the step of providing the substrate with a plurality of conductive contact pads distributed over at least portions of the second substrate surface, the contact pads suitable for the attachment of reflow elements.

3. The method according to claim 2 further comprising the step of attaching a reflow element to each contact pad, whereby the plurality of reflow elements are substantially coplanar with the substrate and the chip.

4. The method according to claim 1 wherein the chuck has an effectively convex surface area for the complete substrate area or a portion of the substrate area.

5. The method according to claim 1 wherein the effective convexity of the chuck surface is approximated by elevating the center portion of the chuck over the remainder of the chuck surface.

6. The method according to claim 5 wherein the characteristics of the encapsulation compound include the amount, composition, and polymerization of the encapsulation compound.

* * * * *